(12) United States Patent
Cheng et al.

(10) Patent No.: US 6,235,995 B1
(45) Date of Patent: May 22, 2001

(54) FLEXIBLE PRINTED CABLE WITH GROUND PLANE AND REQUIRED IMPEDANCE

(75) Inventors: Ken Cheng, Santa Clara; Chih-Hsien Chou, San Jose; Eric Juntwait, Irvine, all of CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/539,657

(22) Filed: Mar. 30, 2000

Related U.S. Application Data

(63) Continuation of application No. 09/054,372, filed on Apr. 2, 1998.

(51) Int. Cl.[7] .................................................... H05K 1/03
(52) U.S. Cl. .................... 174/254; 174/250; 361/789; 361/799
(58) Field of Search ................ 174/117 F, 117 FF, 174/250, 254; 361/789, 799, 777

(56) References Cited

U.S. PATENT DOCUMENTS

| | | | |
|---|---|---|---|
| 4,992,059 | * | 2/1991 | King et al. ................. 174/117 FF X |
| 5,012,047 | * | 4/1991 | Dohya .................................. 174/250 |
| 5,844,783 | * | 12/1998 | Kojima ................................. 361/777 |

* cited by examiner

*Primary Examiner*—Albert W. Paladini
(74) *Attorney, Agent, or Firm*—Wei Te Chung

(57) ABSTRACT

An FPC assembly (10) includes a circuit unit (12) with two different pitch arrangement connectors (14, 16) at two opposite ends. The circuit unit (12) includes a signal FPC (18) and a grounding FPC (20). A buffer layer (22) with adhesives on two opposite surfaces (24, 26) is sandwiched between the signal FPC (18) and the grounding FPC (20), and thus the signal FPC (18), the buffer layer (22) and the grounding FPC (20) are adhesively fastened with one another as one circuit unit (12). The signal FPC (18), the buffer layer (22) and the grounding FPC (20) respectively include contact tail holes (34, 35) at two opposite ends for receivable engagement with the corresponding contact tails (36, 37) of the connectors (14, 16).

5 Claims, 3 Drawing Sheets

FLEXIBLE PRINTED CABLE WITH GROUND PLANE AND REQUIRED IMPEDANCE

This is a Continuation application of the copending application Ser. No. 09/054372 filed Apr. 2, 1998.

BACKGROUND OF THE INVENTION

1. Field of The Invention

The invention relates to a flexible printed circuit (FPC) assembly, and particularly to an FPC with a ground plane and the corresponding required impedance thereof.

2. The Related Art

Historically, cable assemblies and connectors within a computer, transfer data at low speeds, which did not readily lead to signal degradation due to electromagnetic phenomenon such as impedance, skew, propagation delay, and crosstalk. As signal speed continue to increase, however, these phenomena can create severe problems within the computer system. An effort is therefore being made to control various electrical characteristics of cable assemblies and associated connector within the computer enclosure. Under this situation, the cable assembly generally utilizes a built-in grounding plane to control impedance and minimize skew, propagation delay and crosstalk.

It is also noted that in some situations two different pitch/dimension connectors are designed to be positioned at two ends of the cable assembly to respectively connect to two different pitch/dimension complementary connectors. Under this condition, for the traditional flat cable assembly, a cable having the same pitch arrangement with one connector is used and an additional small printed circuit board is used to be interface between the cable and the other connector to compensate the difference of the pitch arrangements therebetween. Alternatively, an FPC (Flexible Printed Circuit) is another approach to connect the two connectors by means that the circuit traces thereof can be designedly and intentionally configured in either a divergent or a convergent manner to meet the pitch arrangement of the corresponding connectors at either end of the FPC.

Accordingly, FPCs are used in many electronics applications where the size and the flexibility are concerns. Usually the FPC replaces several other components thus justifying the relatively high cost of this technology. In most cable assembly applications, the cost of FPCs can not be justified when compared to the standard flat ribbon cable. In addition, the performance advantage of FPC does not make much difference at slower signal speeds. However, in such a case where a transition of pitch arrangement between the end connectors occurs and the requirement for the faster data transfer rates exists, the FPC solution exhibits a very high level of performance and reliability without severe cost differential.

Understandably, even though the traditional FPC can satisfy the pitch transition between two different pitch arrangement connectors, yet the traditional FPC can not fit for the aforementioned current high speed transmission condition. As mentioned before, a grounding plane is required in the cable assembly for the high speed transmission.

Although the existing FPC (cable) assembly may include two integral layers of which one is for signal transmission and the other one is for grounding paths, the grounding layer(plane) does not provide the required impedance of the whole assembly. This is because the grounding layer and the signal layer should be spaced from each other at a significant distance by an intermediate dielectric layer. The character of the traditional FPC, which may present more than one integral signal/grounding layers therein for flexibility of disposition and miniaturization of dimension in comparison with the traditional ribbon flat cable, can not reach this requirement, anyhow.

Therefore, an object of the invention is to provide a modified FPC (cable) assembly which not only maintains the advantages of the traditional FPC cable assembly, e.g. the flexibility of disposition and the reduced dimension thereof in comparison with the ribbon flat cable, but also owns the required impedance thereof for use in the current high speed transmission.

SUMMARY OF THE INVENTION

According to an aspect of the invention, an FPC assembly includes a circuit unit with two different pitch arrangement connectors at two opposite ends. The circuit unit includes a signal FPC and a grounding FPC. A buffer layer with adhesives on two opposite surfaces is sandwiched between the signal FPC and the grounding FPC, and thus the signal FPC, the buffer layer and the grounding FPC are adhesively fastened with one another as one circuit unit. The signal FPC, the buffer layer and the grounding FPC respectively include contact tail holes at two opposite ends for receivable engagement with the corresponding contact tails of the connectors.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
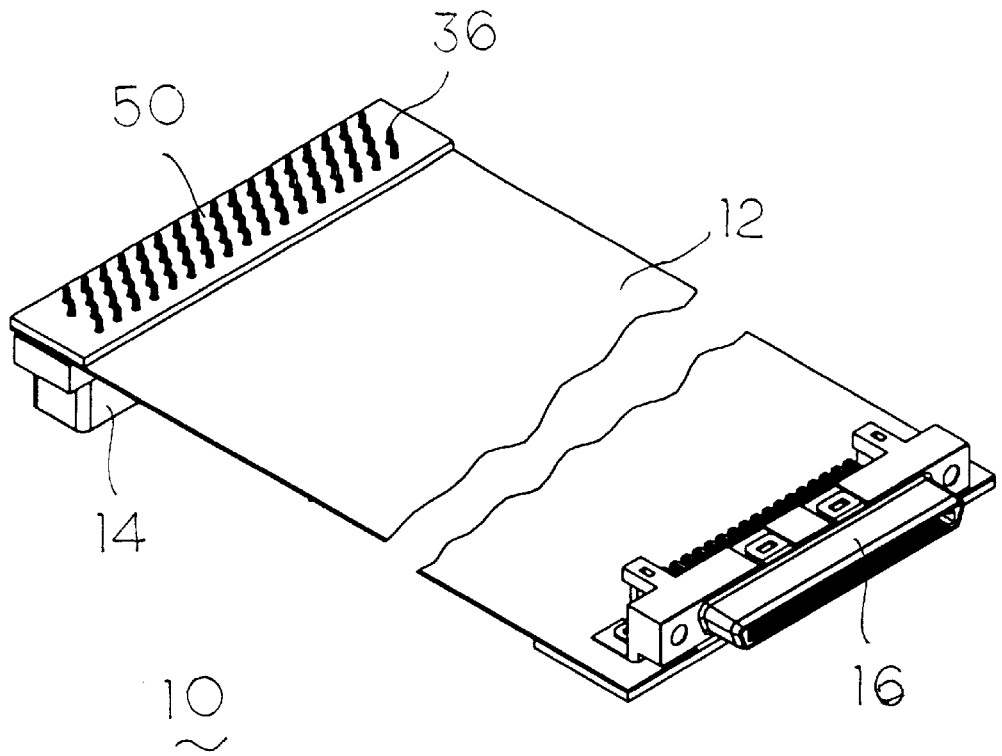
FIG. 1 is a perspective view of a presently preferred embodiment of an FPC assembly according to the invention.
Figure 2:
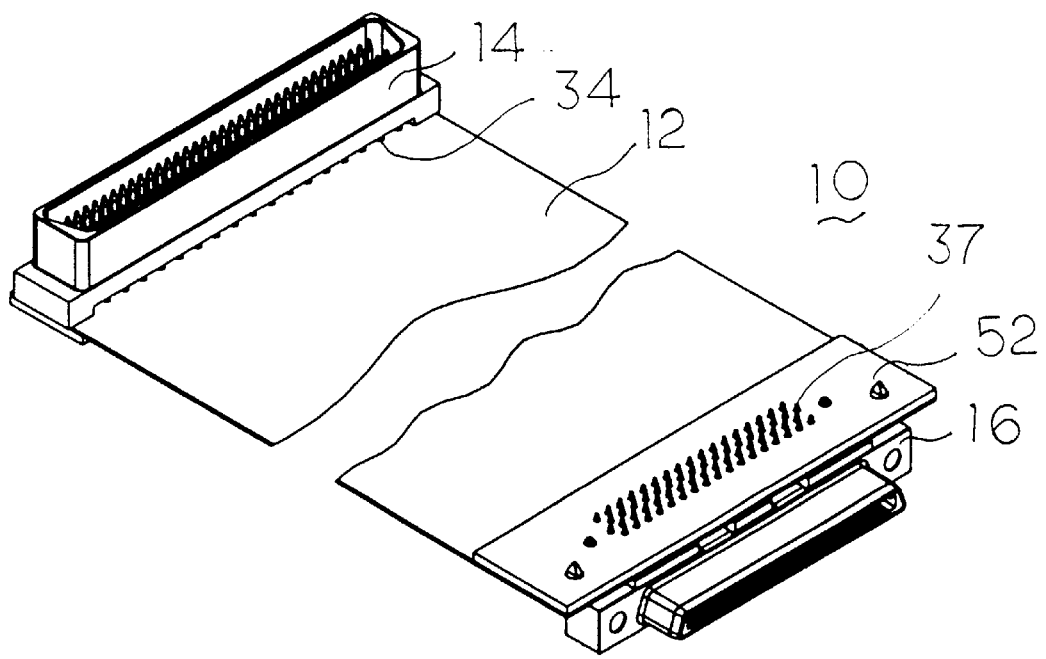
FIG. 2 is another perspective view of the FPC assembly of FIG. 1.
Figure 3:
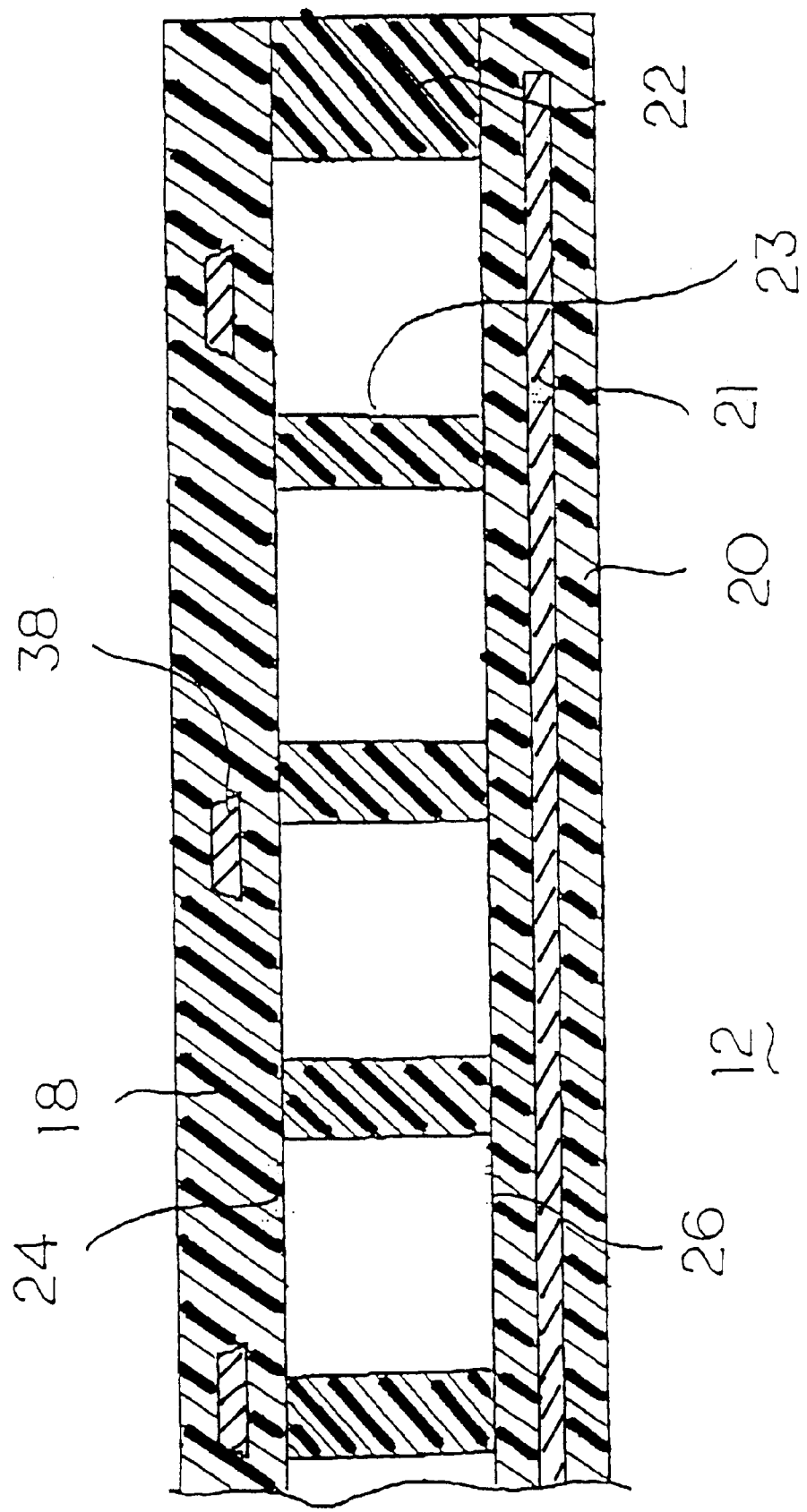
FIG. 3 is a cross-sectional view of the circuit unit of the FPC assembly of FIG. 1.

It will be noted here that for a better understanding, most of like components are designated by like reference numerals throughout the various figures in the embodiments. Attention is directed to FIGS. 1–3 wherein an FPC assembly 10 includes a circuit unit 12 with two different pitch/dimension arrangement connectors 14, 16 at two opposite ends thereof. The connector 14 is a so-called vertical 68 positions SCSI plug and the connector 16 is a so-called right angle 68 positions VHDCI (Very High Density Connector Interface) wherein the pitch of the connector 14 is 1.27 mm and the pitch of the connector 16 is 0.8 mm.

Referring to FIG. 3, the circuit unit 12 includes a signal FPC 18 and a grounding plane FPC 20 (both made from polymide or polyester) with a buffer layer 22 (made from Mylar) sandwiched therebetween wherein the opposite surface 24, 26 of the buffer layer 22 is provided with adhesives thereon so as to reliably attach the corresponding signal FPC 18 and grounding plane FPC 20 thereto, thus integrating the signal FPC 18, the grounding plane FPC 20 and the buffer layer 22 together to be one piece circuit unit 12.

The buffer layer 22 includes holes 23 (FIG. 3) provided in a continuous pattern for increasing the dielectric constant thereof thus allowing decreasing the thickness of the buffer layer 22.

Figure 4:
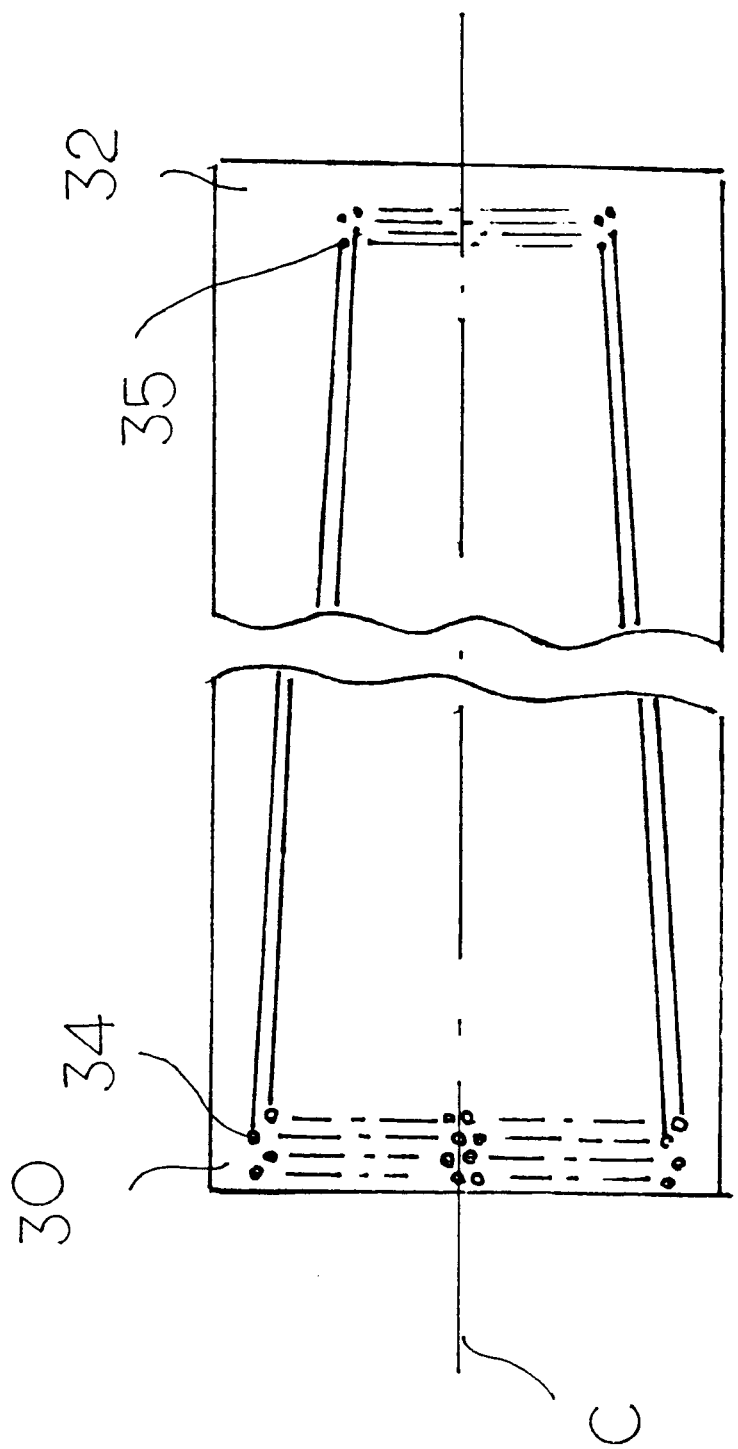
FIG. 4 is a layout of the signal FPC of the FPC assembly of FIG. 1.

Referring to FIGS. 1, 2 and 4, each of the signal FPC 18, the grounding plane FPC 20 and the buffer layer 22 includes two connection areas 30, 32 at two opposite ends corresponding to the connectors 14, 16. Each area 30, 32 defines plural rows of contact tail apertures 34, 35 for receiving the contact tails 36, 37 of the connectors 14, 16.

The signal FPC 18 further includes a plurality of conductive traces or conductors 38 (FIG. 3) extending in the lengthwise direction between the corresponding pairs of contact tail apertures 34 & 35, respectively. It is seen because of different pitch arrangements between the connectors 14, 16, the corresponding pair of the contact tail apertures 34, 35 are spaced from the center line C (FIG. 4) with different distance. Therefore, the traces 38 run convergent from the connector 14 to the connector 16, thus minimizing signal skew problems between the outer side contacts and the center contacts. Anyhow, parallel traces with right angle configurations are also accepted to be used for implementation. Understandably, the grounding FPC 20 includes a grounding plane 21 (FIG. 3) therein for cooperation with the traces 38 in the signal FPC 18.

As mentioned earlier, the traditional FPC may include signal layer and the grounding layer while lacks the proper distance and the corresponding different material dielectric material therebetween. The material of the invention has been introduced in the foregoing description, the thickness of buffer layer 22 may be about 5.87 mils which exhibits a, 85 ohm characteristic impedance as required.

The invention provides a new type FPC assembly which includes a signal FPC and a grounding FPC sandwiching therebetween a buffer layer with its proper thickness and dielectric property wherein the buffer layer 22 provides adhesives on two opposite surface 24, 26 for reliable attachment with the corresponding signal FPC 18 and the grounding FPC 20 for forming as an integral circuit unit 12. The whole FPC assembly 10 provides advantages of not only the less width dimension and pitch transition between two different connectors at two ends as being adapted to be obtained by the traditional one piece unitary FPC, but also the desired impedance thereof which can not be reached by the traditional unitary simplex FPC.

Referring to FIG. 1, when assembling the connectors 14, 16 to the connection areas 30, 32, stiffening plates 50, 52 may be applied to the opposite surface with regard to the connectors 14, 16 for reinforcement.

It is also appreciated that the connectors 14 and 16 are respectively mounted at two opposite ends and on opposite surfaces 24, 26 of the circuit unit 12 that may perform a better counterbalance arrangement.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. An FPC (Flexible Printed Circuit) assembly comprising:
   a circuit unit comprising a signal FPC, a grounding FPC and an integrally uniform buffer layer sandwiched therebetween, two different pitch arrangement connectors being disposed at opposite ends of said FPC assembly, wherein the buffer layer has different dielectric characteristic from the signal FPC and the grounding FPC and a proper thickness thereof and a plurality of through holes extending vertically through said buffer layer which exhibits a desired amount of impedance, wherein said buffer layer is provided with adhesives on two opposite surfaces for reliable attachment to the corresponding signal FPC and grounding FPC so as to integrally form said circuit unit, and wherein no other means extends through the buffer layer except said through holes.

2. The FPC assembly as defined in claim 1, wherein the signal FPC, the buffer layer and the grounding FPC include connection areas with contact tail apertures therein corresponding to the connectors.

3. The FPC assembly as defined in claim 2, wherein the conductive traces between pairs of corresponding contact tail apertures are convergent from one end to the other end.

4. The FPC assembly as defined in claim 2, wherein a stiffening plate is provided on the other surface of the circuit unit with regard to the corresponding connector around the connection area.

5. An FPC assembly comprising:
   a circuit unit with two different pitch arrangement connectors mounted on two connection areas at two opposite ends thereof; wherein
   said circuit unit includes a signal FPC and a grounding FPC commonly tightly sandwiching an adhesive integrally uniform buffer layer therebetween so as to form an integral piece thereof;
   said buffer layer is dimensioned with proper thickness thereof and a plurality of fully emptied through holes extending completely through said buffer layer which exhibits a desired amount of impedance; and
   no other means extends through the buffer lay except said fully emptied through holes.

* * * * *